(12) United States Patent
Sim et al.

(10) Patent No.: US 9,673,827 B2
(45) Date of Patent: Jun. 6, 2017

(54) INJECTION LOCKED DIGITAL FREQUENCY SYNTHESIZER CIRCUIT

(71) Applicant: POSTECH ACADEMY-INDUSTRY FOUNDATION, Pohang-si, Gyeongsangbuk-do (KR)

(72) Inventors: Jae Yoon Sim, Pohang-si (KR); Seung Hwan Hong, Seoul (KR)

(73) Assignee: POSTECH ACADEMY-INDUSTRY FOUNDATION, Pohang-si, Gyeongsangbuk-Do (KR)

( * ) Notice: Subject to any disclaimer, the term of this patent is extended or adjusted under 35 U.S.C. 154(b) by 0 days.

(21) Appl. No.: 14/910,129

(22) PCT Filed: Aug. 7, 2014

(86) PCT No.: PCT/KR2014/007316
§ 371 (c)(1),
(2) Date: Feb. 4, 2016

(87) PCT Pub. No.: WO2015/030386
PCT Pub. Date: Mar. 5, 2015

(65) Prior Publication Data
US 2016/0182068 A1    Jun. 23, 2016

(30) Foreign Application Priority Data
Aug. 30, 2013 (KR) .................. 10-2013-0103808

(51) Int. Cl.
*H03L 7/197* (2006.01)
*H03L 7/083* (2006.01)
(Continued)

(52) U.S. Cl.
CPC .......... *H03L 7/1974* (2013.01); *G04F 10/005* (2013.01); *H03L 7/083* (2013.01);
(Continued)

(58) Field of Classification Search
CPC ............................................ H03L 7/23–7/235
See application file for complete search history.

(56) References Cited

U.S. PATENT DOCUMENTS

| | | | | |
|---|---|---|---|---|
| 4,817,199 A | * | 3/1989 | Wallraff | ............... H03D 13/004 331/55 |
| 6,584,574 B1 | * | 6/2003 | Embree | .................. H03L 7/235 327/156 |

(Continued)

FOREIGN PATENT DOCUMENTS

| | | |
|---|---|---|
| KR | 10-2004-0027758 | 4/2004 |
| KR | 10-2010-0083262 | 7/2010 |
| KR | 10-2011-0081837 | 7/2011 |

OTHER PUBLICATIONS

International Search Report with English translation for International Application No. PCT/KR2014/007316, dated Nov. 25, 2014.
(Continued)

*Primary Examiner* — Thomas J Hiltunen
(74) *Attorney, Agent, or Firm* — Kile Park Reed & Houtteman PLLC

(57) ABSTRACT

The present invention relates to a technique capable of implementing a frequency synthesizer circuit separated into a frequency synthesizer circuit part and an injection locked PLL circuit part and sequentially performing a frequency synthesizer lock operation and an injection lock operation to implement fast frequency and phase locking. The present invention comprises: a frequency synthesizer configured to perform a frequency and phase lock operation according to fractional number information and a first reference cock signal supplied from outside and thereby output a reset signal and a second reference clock signal; and an injection locked PLL configured to start a frequency lock operation after being reset by the reset signal inputted when the frequency synthesizer is frequency-locked, receive the sec-
(Continued)

ond reference clock signal as a reference clock, multiply the second reference clock signal by an integer multiple of target frequency, and output an output clock signal.

19 Claims, 14 Drawing Sheets

(51) Int. Cl.
    *H03L 7/099* (2006.01)
    *H03L 7/23* (2006.01)
    *G04F 10/00* (2006.01)
    *H03L 7/095* (2006.01)
    *H03M 3/00* (2006.01)

(52) U.S. Cl.
    CPC ............ *H03L 7/095* (2013.01); *H03L 7/0992* (2013.01); *H03L 7/0995* (2013.01); *H03L 7/1976* (2013.01); *H03L 7/23* (2013.01); *H03M 3/39* (2013.01); *H03L 2207/50* (2013.01)

(56) References Cited

U.S. PATENT DOCUMENTS

| | | | | |
|---|---|---|---|---|
| 6,914,464 B2* | 7/2005 | Maeda | .................. | H03L 7/1806 327/147 |
| 6,970,030 B1* | 11/2005 | Huang | ..................... | G06F 7/68 327/156 |
| 7,394,321 B2* | 7/2008 | Conta | ....................... | H03L 7/07 331/12 |
| 7,495,516 B2* | 2/2009 | Travis | ..................... | G06F 1/025 331/2 |
| 7,574,185 B2* | 8/2009 | Ko | ............................ | H03L 7/23 455/255 |
| 7,576,576 B2* | 8/2009 | Drexler | .................... | H03L 7/07 327/147 |
| 7,848,266 B2* | 12/2010 | Man | ........................... | H03L 7/23 327/105 |
| 2008/0063129 A1* | 3/2008 | Voutilainen | ........... | H03L 7/0802 375/376 |
| 2012/0161827 A1* | 6/2012 | Madeira | .................... | G06F 1/06 327/147 |
| 2013/0271229 A1* | 10/2013 | Gao | .......................... | H03L 7/06 331/19 |
| 2014/0062605 A1* | 3/2014 | Stengel | ................... | H03L 7/099 331/34 |

OTHER PUBLICATIONS

Written Opinion with English translation for International Application No. PCT/KR2014/007316, dated Nov. 25, 2014.

* cited by examiner

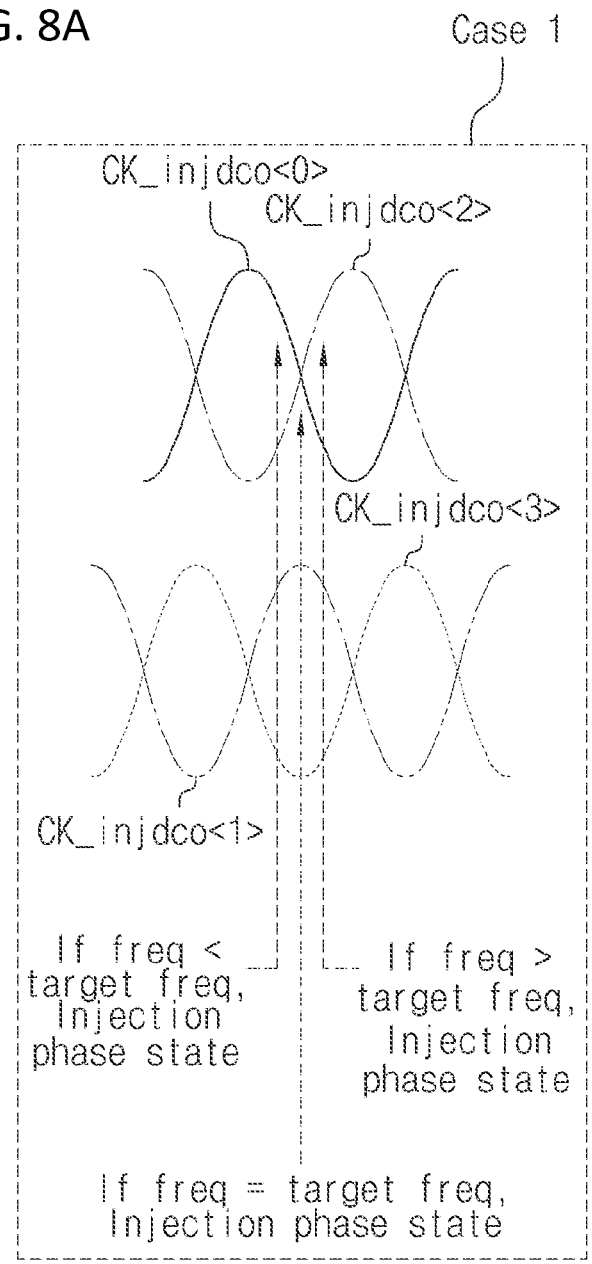

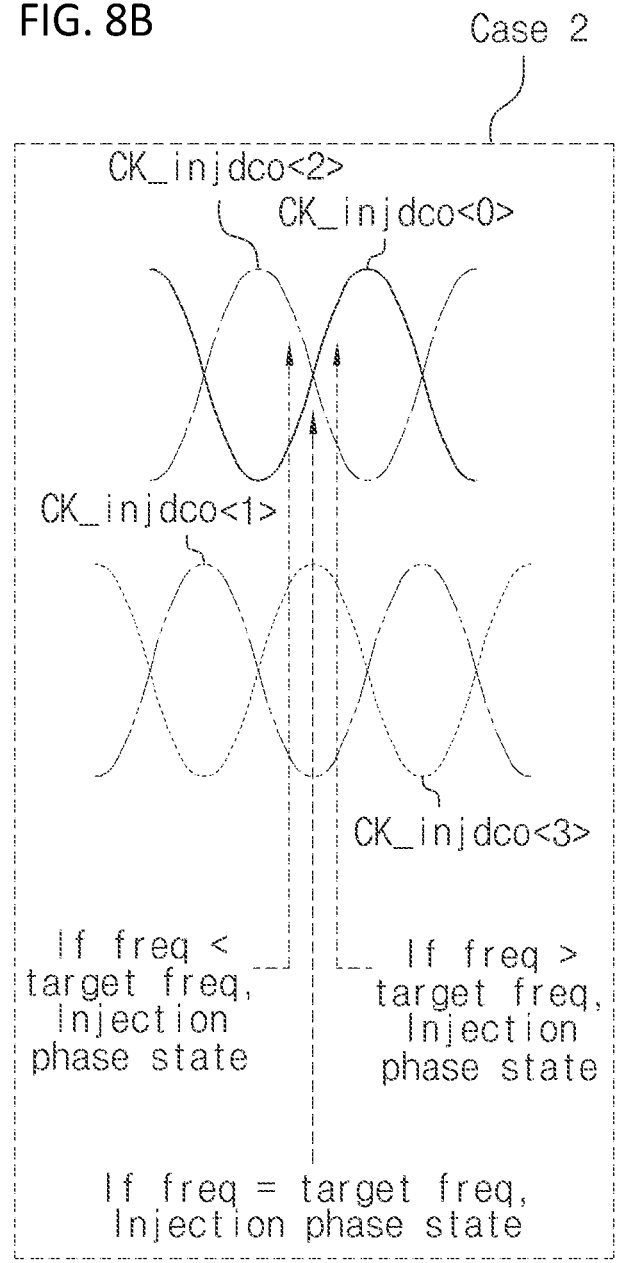

INJECTION LOCKED DIGITAL FREQUENCY SYNTHESIZER CIRCUIT

TECHNICAL FIELD

The present disclosure relates to a technique capable of implementing an injection locked digital frequency synthesizer circuit, and more particularly, to an injection locked digital frequency synthesizer circuit capable of implementing fast frequency and phase locking through a structure obtained by dividing a frequency synthesizer circuit into a frequency synthesizer circuit part and an injection locked PLL (Phase Locked Loop) circuit part.

BACKGROUND ART

In general, the output clock frequency of a PLL is fixed to a value obtained by dividing the frequency of an input clock by the division ratio of a PLL divider. For example, an integer-N PLL indicates a PLL where N is an integer. When the input frequency of the integer-N PLL is 40 MHz and the division ratio N of the divider is 8, the output frequency of the PLL is fixed to 320 MHz.

On the other hand, a fractional-N PLL (frequency synthesizer) includes a divide which has a division ratio consisting of an integer and a decimal fraction, and a fractional number k controls the decimal fraction. Thus, although the input frequency of the fractional-N PLL is fixed to 40 MHz, the PLL in which the division ratio N of the divider is set to (8+fractional number k) can control k. Therefore, an arbitrary frequency between 320 MHz and 360 MHz can be generated as the output frequency.

However, since a divider capable of implementing a decimal frequency does not exist in reality, a divider with a division ratio of N and a divider with a division ratio of N+1 must be alternately used in order to implement a frequency synthesizer which outputs a decimal frequency.

Thus, the frequency synthesizer has a basic structure which is based on the basic structure of an integer-N PLL, uses a divider for dividing N or (N+1) frequency instead of a divider of which the division ratio is N, and additionally includes a DSM (Delta-Sigma Modulator) to select the N or (N+1) frequency.

As such, the conventional frequency synthesizer locks the phase and frequency of an output clock to the average of a clock divided by N and a clock divided by (N+1). Thus, the conventional frequency synthesizer requires quite a long time for frequency locking.

Furthermore, since the conventional frequency synthesizer includes a plurality of blocks, the power consumption is increased by the blocks.

DISCLOSURE

Technical Problem

Various embodiments are directed to a technique capable of implementing a frequency synthesizer circuit separated into a frequency synthesizer circuit part and an injection locked PLL circuit part and sequentially performing a frequency synthesizer lock operation and an injection lock operation, thereby implementing fast frequency and phase locking.

Technical Solution

In an embodiment, an injection locked digital frequency synthesizer circuit may include: a frequency synthesizer configured to perform a frequency and phase lock operation according to a fractional number and a first reference clock signal supplied from outside, and output a reset signal and a second reference clock signal; and an injection locked PLL (Phase Locked Loop) configured to start a frequency lock operation after being reset by the reset signal inputted when the frequency synthesizer is frequency-locked, receive the second reference clock signal as a reference clock, multiply the second reference clock signal by an integer multiple of target frequency, and output an output clock signal.

Advantageous Effects

According to the embodiment of the present invention, the frequency synthesizer circuit is separated into a frequency synthesizer circuit part and an injection locked PLL circuit part to sequentially perform a frequency lock function through the frequency synthesizer circuit part and the injection locked PLL part. When the frequency synthesizer circuit part having relatively large power consumption generates a low-frequency output clock and the injection locked PLL circuit part generates an output clock, the low-frequency clock is outputted as a high frequency through frequency multiplication (8 eight times multiplication). Thus, although a small amount of power is used, the frequency synthesizer circuit can implement the performance of a typical frequency synthesizer.

BRIEF DESCRIPTION OF DRAWINGS

FIGS. 8A and 8B are waveform diagrams illustrating the states of four phases of an internal output clock based on a frequency during an injection lock operation according to the embodiment of the present invention.

MODE FOR INVENTION

Hereafter, exemplary embodiments of the present invention will be described in detail with reference to the accompanying drawings.

Figure 1:
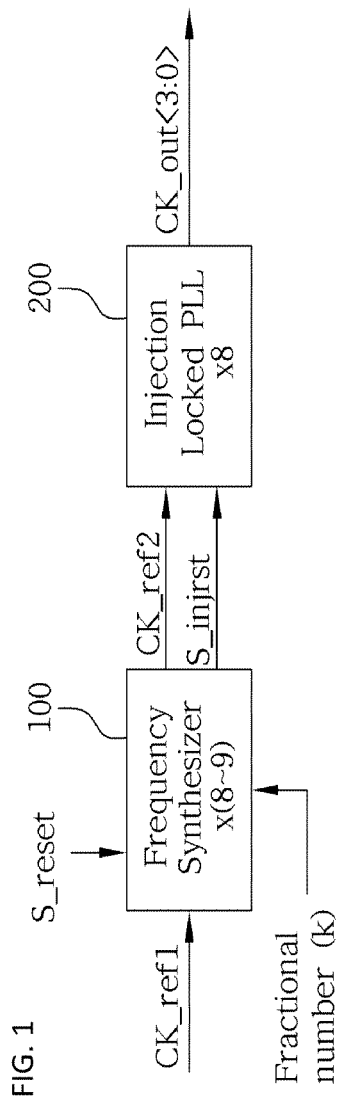
FIG. 1 is a block diagram of an injection locked digital frequency synthesizer circuit according to an embodiment of the present invention.

FIG. 1 is a block diagram of an ultra-low-power injection locked full digital frequency synthesizer circuit according to an embodiment of the present invention. As illustrated in FIG. 1, the injection locked digital frequency synthesizer circuit includes a frequency synthesizer 100 and an injection locked PLL 200.

The frequency synthesizer 100 is a fractional-N PLL which generates a reset signal S_injrst and a second reference clock signal CK_ref2 by performing a frequency and phase lock operation based on a fractional number k and a first reference clock signal CK_ref1 supplied from outside.

The frequency synthesizer 100 generates the second reference clock signal CK_ref2 with a target frequency by dividing the frequency of the first reference clock signal CK_ref1. For this operation, the frequency synthesizer 100 compares the second reference clock signal CK_ref2 to the first reference clock signal CK_ref1, and fixes the division ratio of the second clock signal CK_ref2 to a target integer multiple (for example, 8). At this time, the fractional division ratio of the frequency synthesizer 100 is determined by the fractional number k. For example, the fractional division ratio of the second reference clock signal CK_ref2 may be fixed between eight times and nine times of the frequency of the first reference clock signal CK_ref1 (for example, 8.7) by the fractional number k.

The frequency synthesizer 100 changes (enables) the reset signal S_injrst from high to low, after the frequency and phase lock operation.

Thus, the injection locked PLL 200 is reset to start the frequency lock operation. At this time, the injection locked PLL 200 receives the second reference clock signal CK_ref2 outputted from the frequency synthesizer 100 as a reference clock, multiplies the frequency of the second reference clock signal CK_ref2 by the target integer multiple (for example, eight times), and outputs the result signal as an output clock signal CK_out.

Figure 2:
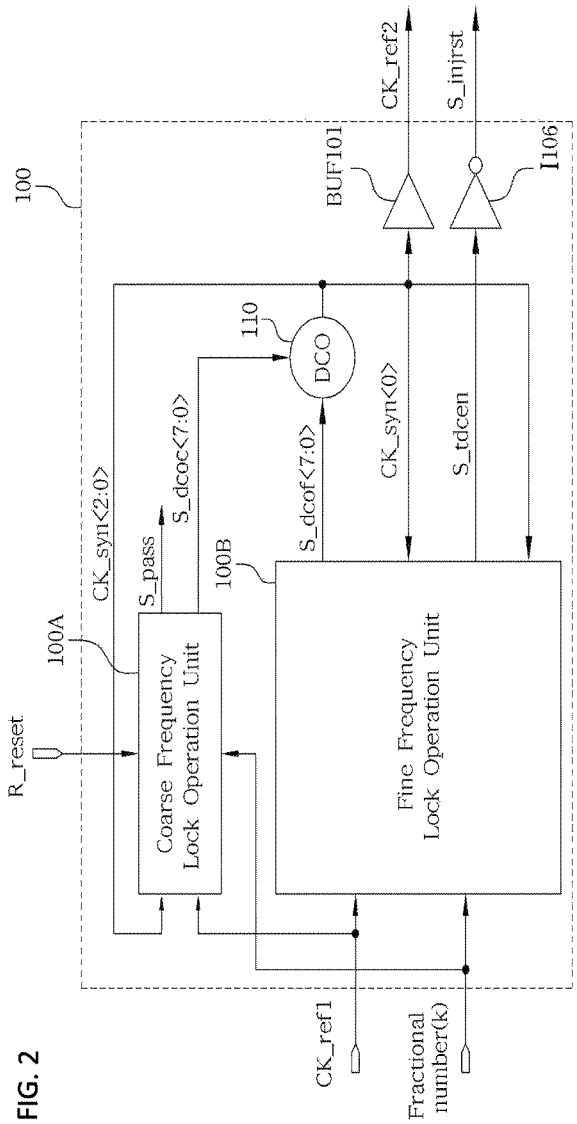
FIG. 2 is a block diagram illustrating the frequency synthesizer according to the embodiment of the present invention.

FIG. 2 is a block diagram illustrating the frequency synthesizer 100 according to the embodiment of the present invention. As illustrated in FIG. 2, the frequency synthesizer 100 includes a digitally controlled oscillator 110, a coarse frequency lock operation unit 100A, a fine frequency lock operation unit 100B, a buffer BUF101, and an inverter I106.

Figure 3A:
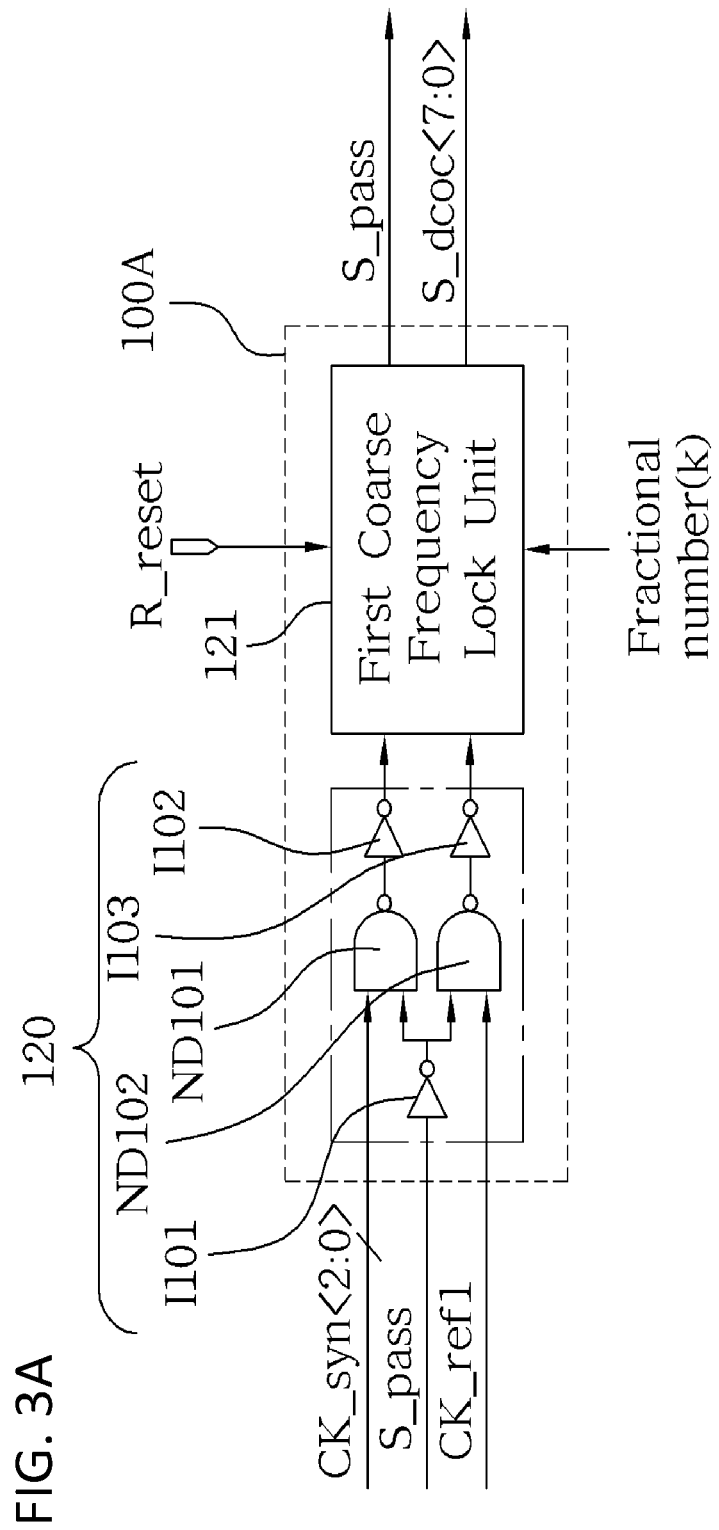
FIGS. 3A and 3B are detailed block diagrams of a coarse frequency lock operation unit and a fine frequency lock operation unit in FIG. 2.

FIG. 3A is a detailed block diagram of the coarse frequency lock operation unit in FIG. 2. As illustrated in FIG. 3A, the coarse frequency lock operation unit 100A includes a first on/off logic unit 120 and a first coarse frequency lock unit 121.

Figure 3B:
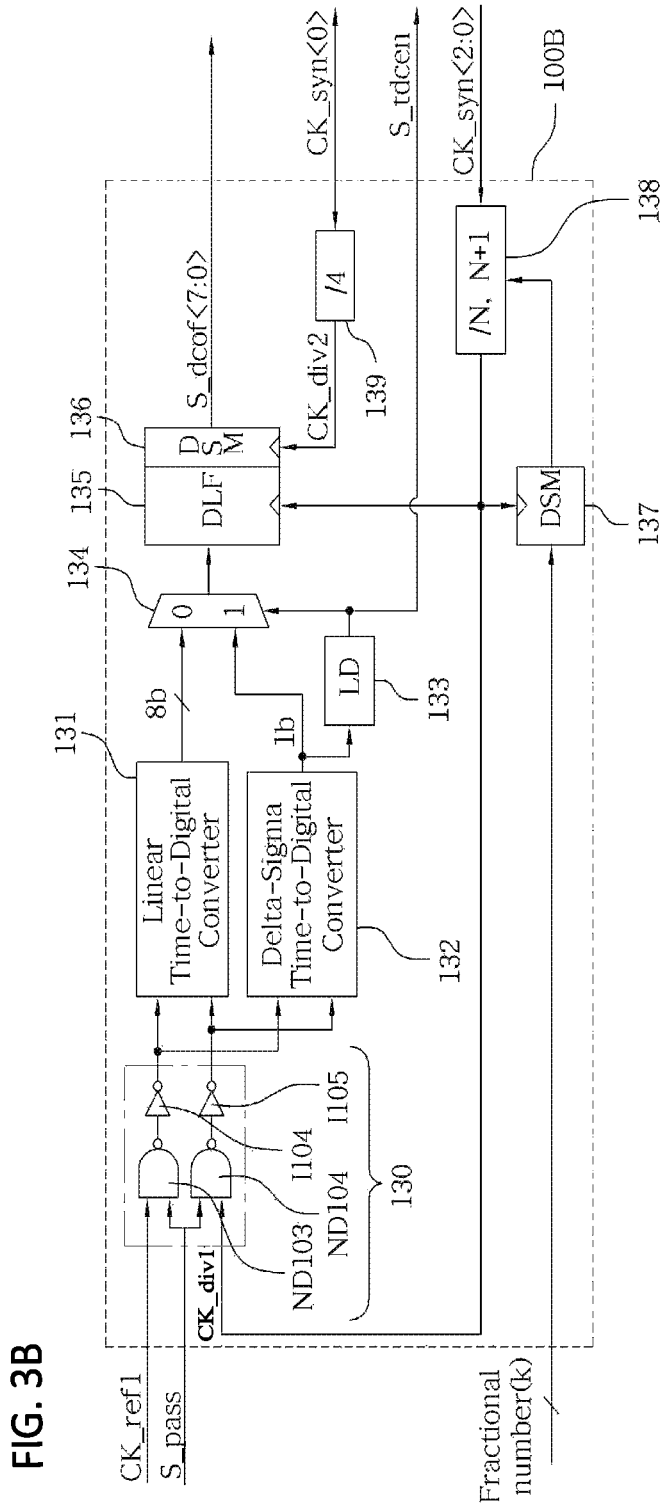

FIG. 3B is a detailed block diagram of the fine frequency lock operation unit in FIG. 2. As illustrated in FIG. 3B, the fine frequency lock operation unit 100B includes a second on/off logic unit 130, a linear time-to-digital converter 131, a delta-sigma time-to-digital converter 132, a lock detector 133, a multiplexer 134, a digital loop filter 135, a primary delta-sigma modulator 136, a tertiary delta-sigma modulator 137, a first divider 138, and a second divider 139.

The first on/off logic unit 120 includes a first inverter I101, a first NAND gate ND101, a second NAND gate ND102, a second inverter I102, and a third inverter I103. The first inverter I101 inverts a coarse frequency locking end signal S_pass. The first NAND gate ND101 has one input terminal configured to receive an oscillation clock signal CK_syn<2:0> and the other input terminal configured to receive an output signal of the first inverter I101. The second NAND gate ND102 has one input terminal configured to receive the output terminal of the first inverter I101 and the other input terminal configured to receive the first reference clock signal CK_ref1. The second inverter I102 inverts an output signal of the first NAND gate ND101. The third inverter I103 inverts the output signal of the second NAND gate ND102.

The second on/off logic unit 130 includes a third NAND gate ND103, a fourth NAND gate ND104, a fourth inverter I104, and a fifth inverter I105. The third NAND gate ND103 performs a NAND operation on the coarse frequency locking end signal S_pass and the first reference clock signal CK_ref1. The fourth NAND gate ND104 performs a NAND operation on the coarse frequency locking end signal S_pass and a divided clock signal CK_div1. The fourth inverter I104 inverts an output signal of the third NAND gate ND103. The fifth inverter I105 inverts an output signal of the fourth NAND gate ND104.

The frequency synthesizer 100 performs a coarse frequency lock mode and a fine frequency lock mode. The coarse frequency lock mode and the fine frequency lock mode will be described in detail as follow.

The coarse frequency lock mode is performed by the digitally controlled oscillator 110 and the coarse frequency lock operation unit 100A.

In the coarse frequency lock mode, the digitally controlled oscillator 110 generates the oscillation clock signal CK_syn<2:0> which has three different phases and oscillates at a preset frequency. The first coarse frequency lock unit 121 outputs the coarse frequency locking end signal S_pass at a low level in the initial state.

The low-level coarse frequency locking end signal S_pass is inverted to a high level through the first inverter I101 of the first on/off logic unit 120, and supplied to the one input terminal of the first NAND gate ND101 and the other input terminal of the second NAND gate ND102. Thus, the first on/off logic unit 120 bypasses the oscillation clock signal CK_syn<2:0> and the first reference cock signal CK_ref1.

Therefore, when the reset signal S_reset transitions from high to low, the first coarse frequency lock unit 121 performs a coarse frequency lock step a preset number of times (for example, 8 times), and outputs a coarse digital oscillation driving signal S_dcoc<7:0> with a predetermined number of bits (for example, 8 bits). At the coarse frequency lock step, the first coarse frequency lock unit 121 receives the first reference clock signal CK_ref1 and the oscillation clock signal CK_syn<2:0> through the first on/off logic unit 120, and compares the frequencies of the first reference clock signal CK_ref1 and the oscillation clock signal CK_syn<2:0> to schematically lock the frequency.

The digitally controlled oscillator 110 generates the oscillation clock signal CK_syn<2:0> having an oscillation frequency corresponding to the coarse digital oscillation driving signal S_dcoc<7:0>. The target oscillation frequency of the first coarse frequency lock unit 121 is determined according to the fractional number k.

When the coarse frequency lock step is performed the preset number of times (for example, 8 times), the first coarse frequency lock unit 121 changes the coarse frequency locking end signal S_pass from low to high. Thus, the input of the first reference clock signal CK_ref1 and the oscillation clock signal CK_syn<2:0> to the first on/off logic unit 120 is blocked. That is, the first on/off logic unit 120 outputs a low signal to both output terminals, regardless of the input of the first reference clock signal CK_ref1 and the oscillation clock signal CK_syn<2:0>. Thus, since no clock signal is inputted to the first coarse frequency lock unit 121, the current consumption of the first coarse frequency lock unit 121 does not occur except leakage current, which makes it possible to minimize the power consumption.

The fine frequency lock mode is performed by the digitally controlled oscillator 110 and the fine frequency lock operation unit 100B.

The coarse frequency locking end signal S_pass outputted at a high level from the first coarse frequency lock unit 121 is supplied to the other input terminal of the third NAND gate ND103 and the one input terminal of the fourth NAND gate ND104. Thus, the second on/off logic unit 130 bypasses the first reference clock signal CK_ref1 and the divided clock signal CK_div1.

Therefore, the linear time-to-digital converter 131 receives the first reference clock signal CK_ref1 and the divided clock signal CK_div1 from the second on/off logic unit 130, and converts a phase difference between the first reference clock signal CK_ref1 and the divided clock signal CK_div1 into a digital code value with a predetermined number of bits (for example, 8 bits).

The lock detector 133 outputs a switching control signal S_tdcen at a low level in the initial state. Thus, the multiplexer 134 is switched by the low-level switching control signal S_tdcen in the initial state, selects the digital code value supplied from the linear time-to-digital converter 131, and outputs the digital code value to the digital loop filter 135.

Thus, at the initial stage of the fine frequency lock mode, the digital loop filter 135 integrates the digital code value, and outputs the integrated difference-frequency digital signal to the primary delta-sigma modulator 136. Thus, the primary delta-sigma modulator 136 outputs a fine digital oscillation driving signal S_dcof corresponding to the integrated digital code value to the digitally controlled oscillator 110.

The fine digital oscillation driving signal S_dcof includes a part of the integrated difference-frequency digital signal supplied from the digital loop filter 135 and a signal obtained by modulating the other part of the difference-frequency digital signal into a second divided clock signal CK_div2 supplied from the second divider 139.

For example, the primary delta-sigma modulator 136 bypasses the upper seven bits of the 22-bit integrated difference-frequency digital signal outputted from the digital loop filter 135, and modulates the lower 15 bits into the second divided clock signal CK_div2. Then, the primary delta-sigma modulator 136 adds the one-bit modulated signal and the upper seven bits, and outputs the result signal as the fine digital oscillation driving signal S_dcof.

Thus, the digitally controlled oscillator 110 generates the oscillation clock signal CK_syn<2:0> having a frequency corresponding to the fine digital oscillation driving signal S_dcof.

The first divider 138 divides one phase of the oscillation clock signal CK_syn<2:0> having three phases, for example, the oscillation clock signal CK_syn<0>, and outputs the divided clock signal CK_div1. For example, the first divider 138 divides the oscillation clock signal CK_syn<0> by eight or nine according to whether the output signal of the tertiary delta-sigma modulator 137 is low or high, and outputs the divided clock signal CK_div1.

However, since the frequency at which the tertiary delta-sigma modulator 137 outputs the output signal at a low or high level is determined by the fractional number k, the frequency of the second reference clock signal CK_ref2 is fixed to a value between eight and nine times of the frequency of the first reference clock signal CK_ref1 (for example, 8.7), according to the fractional number k.

When the frequency and phase of the second reference clock signal CK_ref2 are locked to some extent by the above-described operation of the linear time-to-digital converter 131, the delta-sigma time-to-digital converter 132 alternately outputs low and high signals. The lock detector 133 detects that the delta-sigma time-to-digital converter 132 alternately outputs low and high signals, and outputs the switching control signal S_tdcen at a high level. Then, the multiplexer 134 selects the signal supplied from the delta-sigma time-to-digital converter 132 and outputs the selected signal to the digital loop filter 135.

Furthermore, the switching control signal S_tdcen outputted at a high level is inverted to a low level through the inverter I106. The output signal of the inverter I106 corresponds to the reset signal S_injrst. As the reset signal S_injrst is outputted at a low level, the frequency lock operation of the injection locked PLL 200 is started.

The buffer BUF101 buffers the oscillation clock signal CK_syn<0> supplied from the digitally controlled oscillator 110, and outputs the buffered signal as the second reference clock signal CK_ref2.

Figure 4:
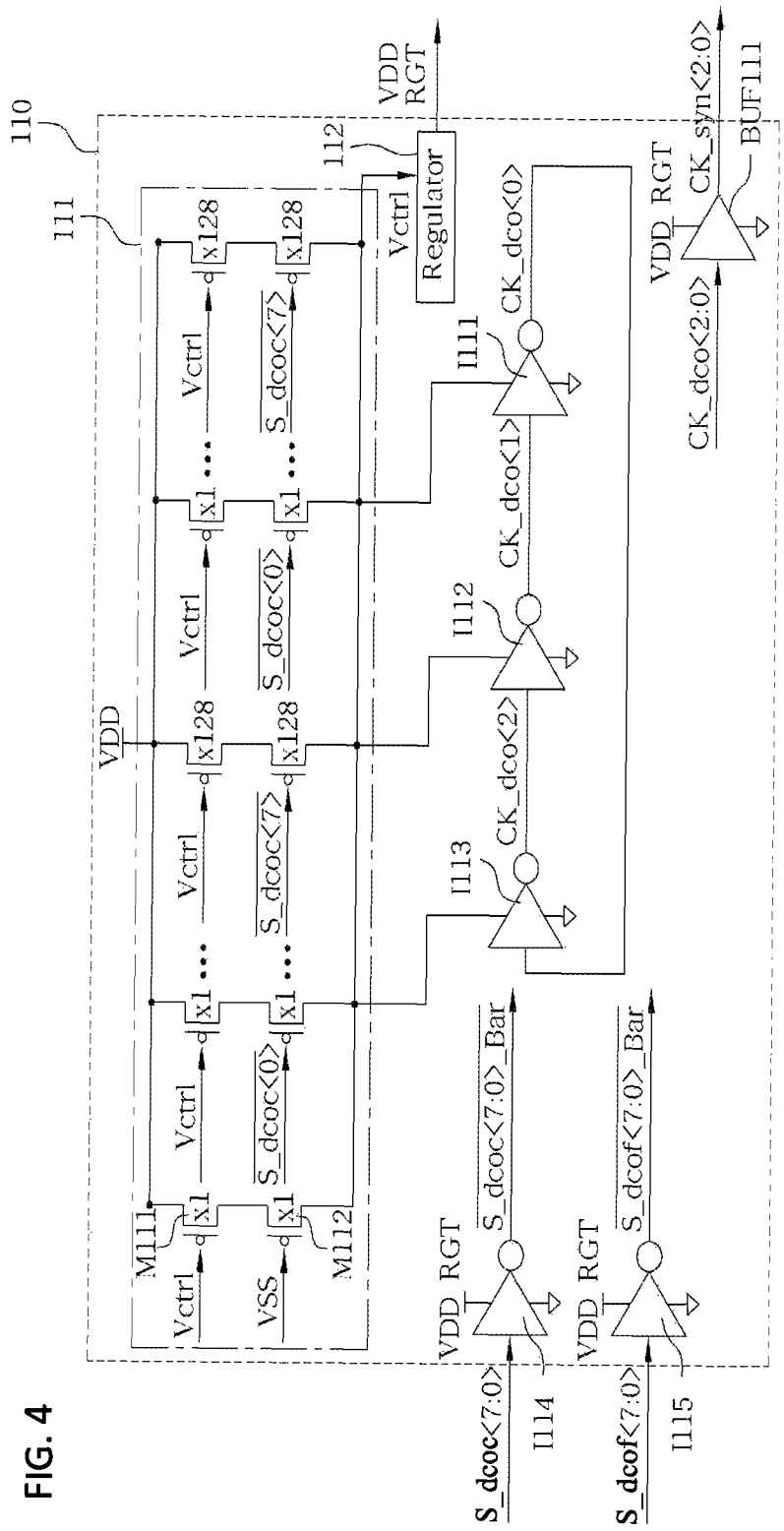
FIG. 4 is a detailed circuit diagram of a digitally controlled oscillator according to the embodiment of the present invention.

FIG. 4 is a detailed circuit diagram of the digitally controlled oscillator 110. As illustrated in FIG. 4, the digitally controlled oscillator 110 includes a digital-to-analog converter 111, a regulator 112, first to fifth inverters I111 to I115, and an output buffer BUF111.

The digital-to-analog converter 111 includes a plurality of upper MOS transistors M111 and lower MOS transistors M112 coupled in series between a supply voltage VDD and a common node CN. The active layer channels of the upper MOS transistors M111 and the lower MOS transistors M112 which are coupled in series may be designed to have different width/length ratios. For example, the active layer channels of the upper MOS transistors M111 and the lower MOS transistors M112 which are coupled in series may be designed to have a minimum width/length ratio of 1 and a maximum width/length ratio of 128.

The fourth inverter I114 inverts the coarse digital oscillation driving signal S_dcoc<7:0>, and outputs the inverted coarse digital oscillation driving signal S_dcoc<8:0>_Bar to the gates of partial lower MOS transistors M112 of the digital-to-analog converter 111.

The fifth inverter I115 inverts the fine digital oscillation driving signal S_dcof<7:0>, and outputs the inverted fine digital oscillation driving signal S_dcof<7:0>_Bar to the gates of the other lower MOS transistors M112 of the digital-to-analog converter 111.

The upper MOS transistors M111 of the digital-to-analog converter 111 receive a frequency control voltage Vctrl outputted from the common node CN of the digital-to-analog converter 111 through the gates thereof.

The regulator 112 outputs a supply terminal voltage VDD_RGT using the frequency control voltage Vctrl outputted from the common node CN of the digital-to-analog converter 111.

The first to third inverters I111 and I113 are configured in three stages, and output clock signals CK_dco<2>, CK_dco<1>, and CK_dco<0> according to the frequency control voltage Vctrl outputted from the common node CN of the digital-to-analog converter 111.

The output buffer BUF111 converts the level of the clock signal CK_dco<2:0> outputted from the first to third inverters I111 and I113.

Thus, the frequency of the oscillation clock signal CK_syn<2:0> of the digitally controlled oscillator 110 is controlled by the inverted coarse digital oscillation driving signal S_dcoc<7:0>_Bar and the inverted fine digital oscillation driving signal S_dcof<7:0>_Bar which are supplied to the gates of the lower MOS transistors M112 of the digital-to-analog converter 111. As described above, the inverted coarse digital oscillation driving signal S_dcoc<7:0>_Bar is supplied from the fourth inverter I114, and the inverted fine digital oscillation driving signal S_dcof<7:0>_Bar is supplied from the fifth inverter I115.

As the clock signal CK_dco<2:0> is outputted through the first to third inverters I111 to I113 in three stages, the power consumption is minimized.

Furthermore, as the frequency of the oscillation clock signal CK_syn<2:0> is controlled according to the frequency control voltage Vctrl generated through the digital-to-analog converter 111 which is operated through a current driving method, the power consumption is minimized.

The level range of the clock signal CK_dco<2:0> outputted through the first to third inverters I111 to I113 in three stages corresponds to a level range between the frequency control voltage Vctrl and the ground voltage VSS. Since the supply voltages of all blocks of the frequency synthesizer 100 are VDD, the level range of the clock signal CK_dco<2: 0> outputted through the first to third inverters I111 to I113 needs to be converted into the level range between the supply voltage VDD and the ground voltage VSS, such that the clock signal CK_dco<2:0> is used by the blocks of the frequency synthesizer 100. In this case, a separate level shifter is needed.

In the present embodiment, however, the regulator 112 is used to generate the supply terminal voltage VDD_RGT having the same level as the frequency control voltage Vctrl, and the supply terminal voltage VDD_RGT is used as the supply voltages of the output buffer BUF111 and all blocks of the frequency synthesizer 100. Thus, the level range of the clock signal CK_dco<2:0> outputted through the first to third inverters I111 to I113 in three stages is converted into the level range between the ground voltage VSS and the supply terminal voltage VDD_RGT outputted from the regulator 112. Therefore, the operating voltage can be lowered to VDD_RGT (about 0.6V to 0.7V) from VDD (1V) without using a separate level shifter, which makes it possible to reduce power consumption.

Figure 5:
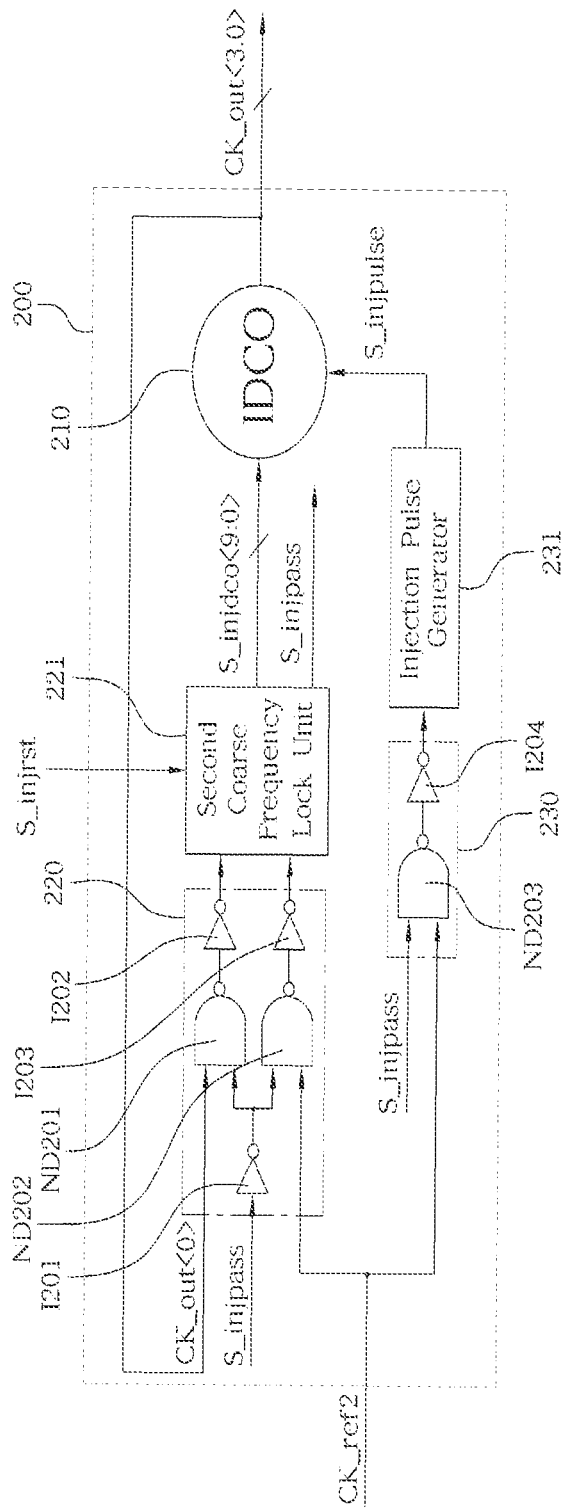
FIG. 5 is a detailed block diagram of an injection locked PLL according to the embodiment of the present invention.

FIG. 5 is a detailed block diagram of the injection locked PLL 200. As illustrated in FIG. 5, the injection locked PLL 200 includes an injection locking digitally controlled oscillator 210, a third on/off logic unit 220, a second coarse frequency lock unit 221, a fourth on/off logic unit 230, and an injection pulse generator 231.

The third on/off logic unit 220 includes a first inverter I201, a first NAND gate ND201, a second NAND gate ND202, a second inverter I202, and a third inverter I203. The first inverter I201 inverts the coarse frequency locking end signal S_injpass. The first NAND gate ND201 has one input terminal configured to receive the output clock signal CK_out<0> and the other input terminal configured to receive an output signal of the first inverter I201. The second NAND gate ND202 has one input terminal configured to receive the output signal of the first inverter I201 and the other input terminal configured to receive the second reference clock signal CK_ref2. The second inverter I202 inverts an output signal of the first NAND gate ND201. The third inverter I203 inverts an output signal of the second NAND gate ND202.

The injection locked PLL 200 performs the coarse frequency lock mode and the injected frequency lock mode. The operation will be described in detail as follow.

The coarse frequency lock mode is performed by the injection locking digitally controlled oscillator 210, the third on/off logic unit 220, and the second coarse frequency lock unit 221.

The difference between the second coarse frequency lock unit 221 and the first coarse frequency lock unit 121 is as follows. Since the frequency synthesizer 100 is a fractional-N PLL, the first coarse frequency lock unit 121 receives the fractional number k and the output clock signal CK_syn<3:0> having three different phases and performs frequency locking for the fractional-N PLL. However, since the injection locked PLL 200 is an integer-N PLL, the second coarse frequency lock unit 221 does not require the fractional number k, but receives the output clock signal CK_out<0> having an arbitrary phase and performs frequency locking for the integer-N PLL.

The injection locking digitally controlled oscillator 210 generates an output clock signal CK_out<3:0> having four different phases, which oscillates at a preset frequency according to an injection locking digitally controlled oscillation driving signal S_injdco<9:0> (hereafter, referred to as an oscillation driving signal) supplied from the second coarse frequency lock unit 221.

At the initial stage, the second coarse frequency lock unit 221 outputs the coarse frequency locking end signal S_injpass at a low level. Thus, the third on/off logic unit 220 bypasses the second reference clock signal CK_ref2 and the output clock signal CK_out<0>.

The second reference clock signal CK_ref2 is a clock signal supplied from the frequency synthesizer 100. Thus, the second coarse frequency lock unit 221 receives the second reference clock signal CK_ref2 and the output clock signal CK_out<0> from the third on/off logic unit 220 at the point of time that the frequency of the second reference clock signal CK_ref2 is locked in the frequency synthesizer 100, that is, at the point of time that the injection locked PLL reset signal S_injrst transitions from high to low.

The second coarse frequency lock unit 211 performs a fine frequency lock step a preset number of times (for example, 10 times) and outputs a 10-bit oscillation driving signal S_injdco<9:0>. During the fine frequency lock step, the second coarse frequency lock unit 211 compares the frequencies of the second reference clock signal CK_ref2 and the output clock signal CK_out<0> and locks the frequency of the output clock signal CK_out<0>.

Thus, the injection locking digitally controlled oscillator 210 generates the output clock signal CK_out<3:0> having a frequency corresponding to the oscillation driving signal S_injdco<9:0>.

After the fine frequency lock step is performed the preset number of times, the second coarse frequency lock unit 221 outputs the coarse frequency locking end signal S_injpass at a high level.

Then, the third on/off logic unit 220 blocks the second reference clock signal CK_ref2 and the output clock signal CK_out<0>. Thus, since no clock signal is inputted to the second coarse frequency lock unit 221, current consumption does not occur except leakage current, which makes it possible to minimize the power consumption.

The injected frequency lock mode is performed by the fourth on/off logic unit 230, the injection pulse generator 231, and the injection locking digitally controlled oscillator 210.

When the second coarse frequency lock unit 221 outputs the coarse frequency locking end signal S_injpass at a high level, the fourth on/off logic unit 230 bypasses the second reference clock signal CK_ref2.

Thus, the injection pulse generator 231 receives the second reference clock signal CK_ref2 and generates an injection pulse S_injpulse.

The injection pulse S_injpulse is generated once during one cycle of the second reference clock signal CK_ref2, and serves to inject-lock the phase of the internal output clock signal CK_injdco<3:0> of the injection locking digitally controlled oscillator 210. The injection pulse S_injpulse is inputted to the injection locking digitally controlled oscillator 210, and serves to lock the frequency. This process is referred to as injection frequency lock.

Therefore, the injection locked PLL 200 starts the frequency lock operation at the point of time that the frequency synthesizer 100 is frequency-locked, that is, at the point of time that the injection locked PLL reset signal S_injrst transitions from high to low. When 10 coarse frequency lock steps are ended, the injection locked PLL 200 outputs the output clock signal CK_out<3:0> having a frequency close to the target frequency according to the oscillation driving signal S_injdco<9:0>.

As described above, the second coarse frequency lock unit 221 outputs the coarse frequency locking end signal S_injpass at a low level in the initial state. When the coarse frequency lock process is ended, the second coarse frequency lock unit 221 outputs the coarse frequency locking end signal S_injpass at a high level. The injection pulse generator 231 is driven by the high-level coarse frequency locking end signal S_injpass, and performs the injection frequency lock process. This process not only injection-locks the phase of the output clock signal CK_out<3:0>, but also finely locks the frequency of the output clock signal CK_out<3:0>.

Figure 6:
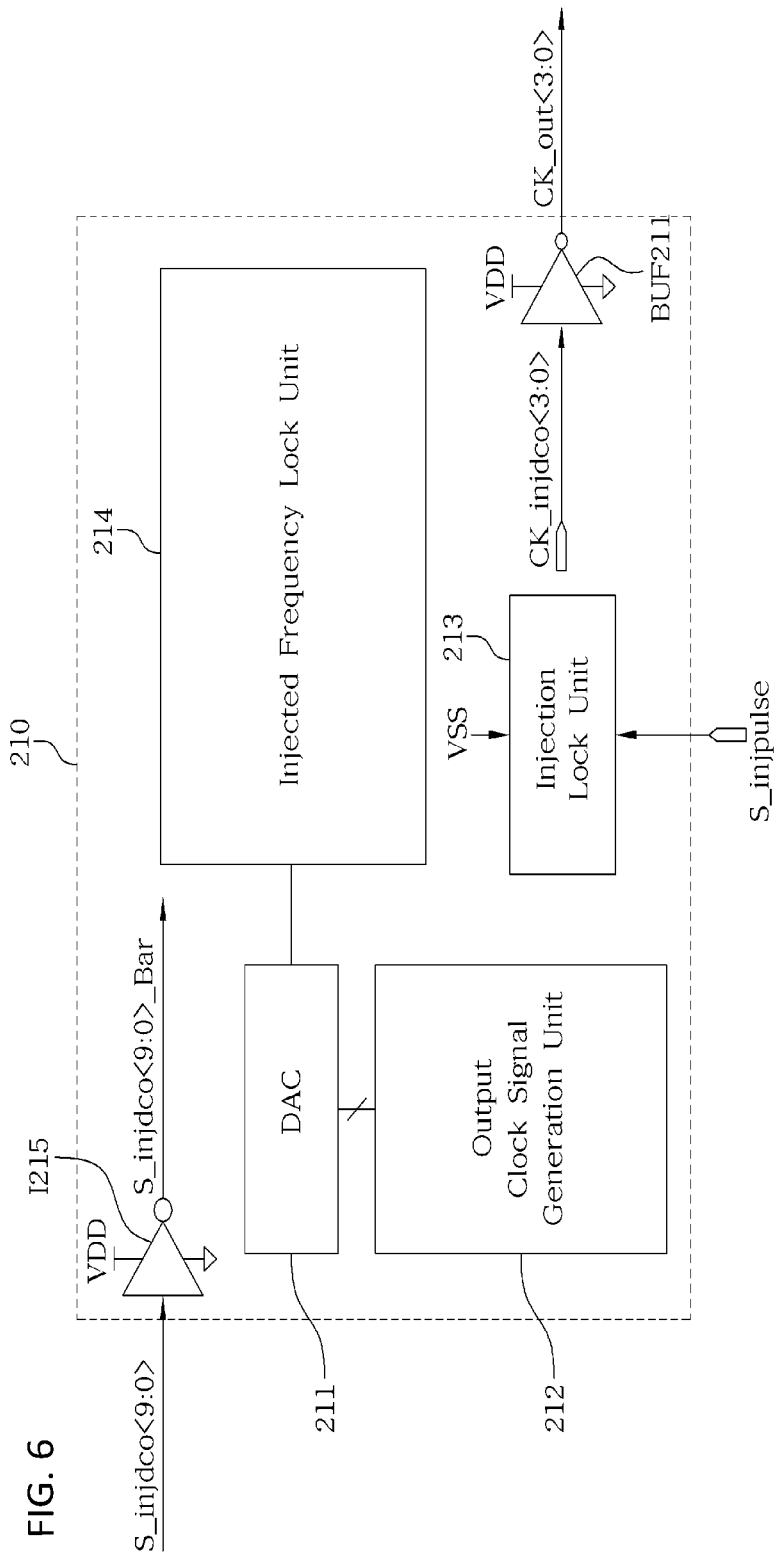
FIG. 6 is a block diagram illustrating an injection locking digitally controlled oscillator according to the embodiment of the present invention.

FIG. 6 is a block diagram illustrating the injection locking digitally controlled oscillator 210. As illustrated in FIG. 6, the injection locking digitally controlled oscillator 210 includes a digital-to-analog converter 211, an output clock signal generation unit 212, an injection lock unit 213, and an injected frequency lock unit 214.

Figure 7A:
FIGS. 7A to 7D are detailed block diagrams of a DAC (Digital-to-Analog Converter), an output clock signal generation unit, an injection lock unit, and an injected frequency lock unit in FIG. 6.
Figure 7B:
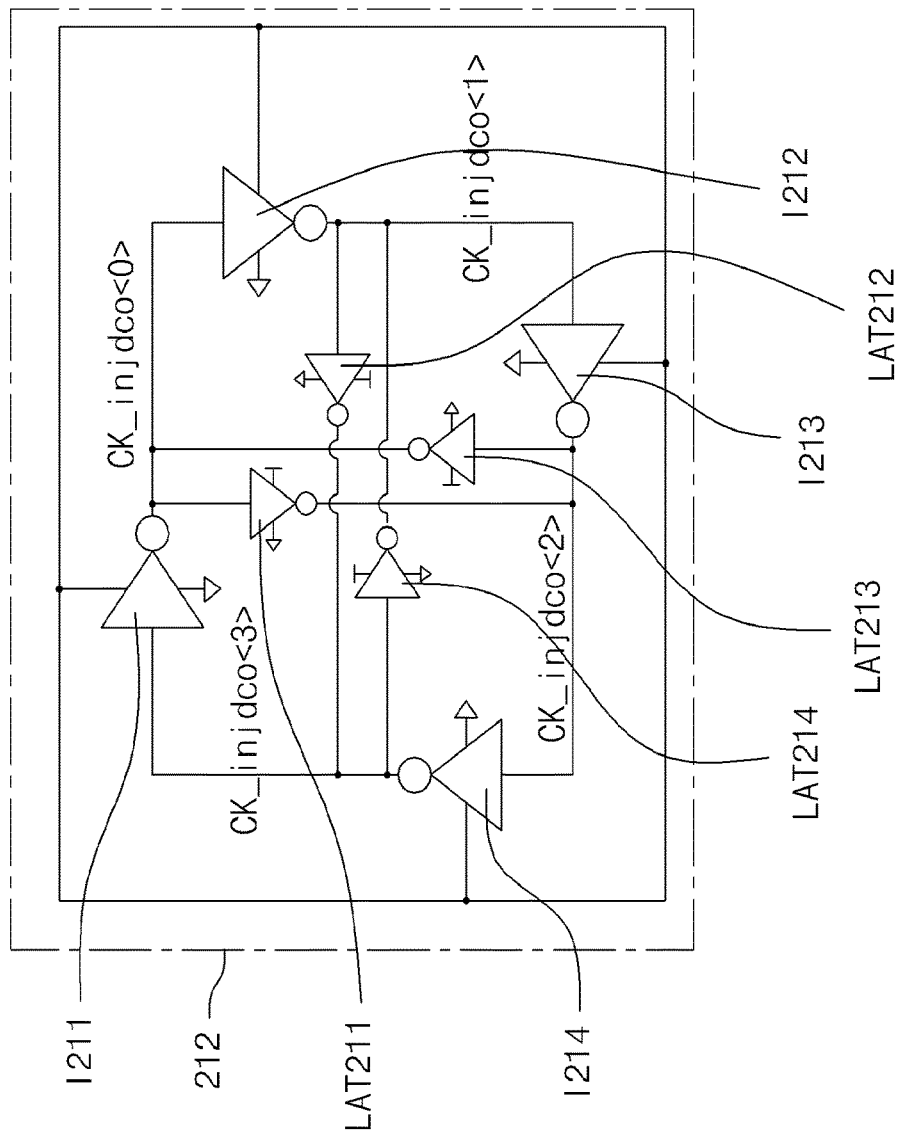
Figure 7C:
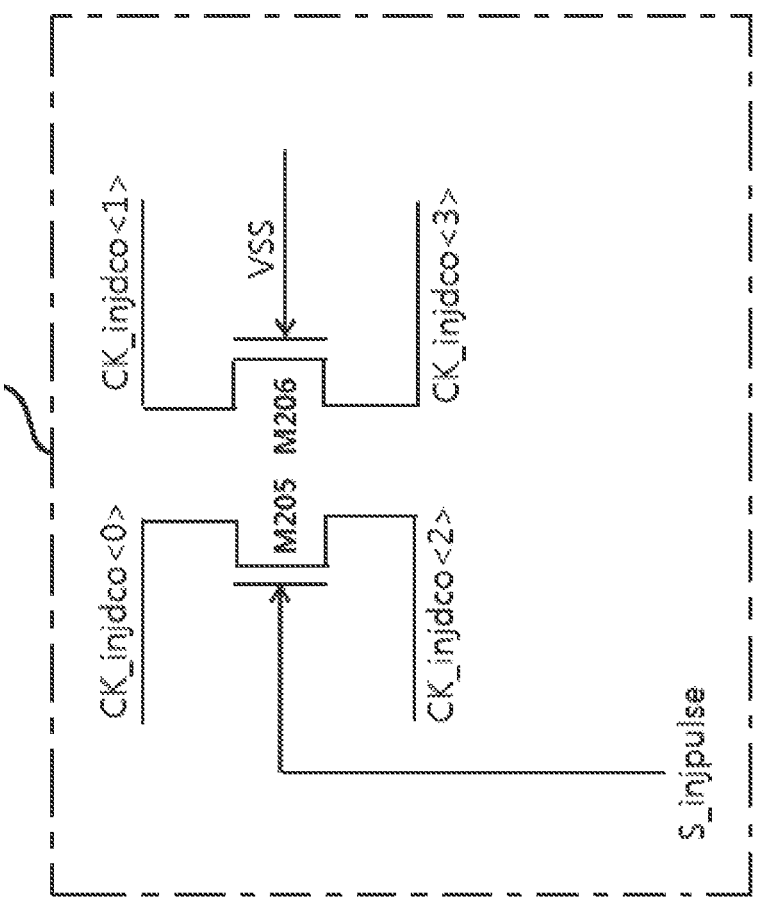
Figure 7D:
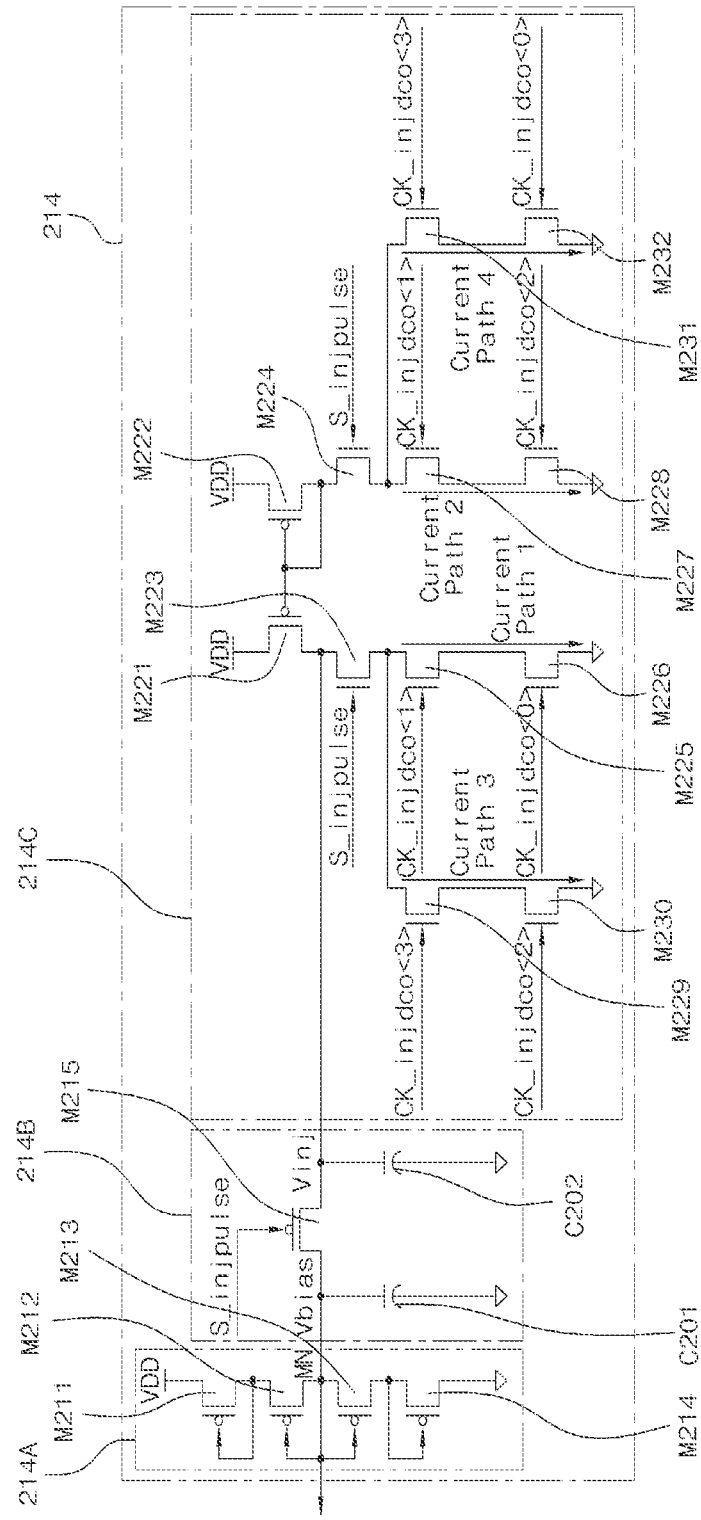

FIG. 7A is a detailed circuit diagram of the digital-to-analog converter of FIG. 6. FIG. 7B is a detailed circuit diagram of the output clock signal generation unit 212 of FIG. 6. FIG. 7C is a detailed circuit diagram of the injection lock unit 213 of FIG. 6. FIG. 7D is a detailed circuit diagram of the injected frequency lock unit 214 of FIG. 6.

The injected frequency lock unit 214 includes an initial condition setting unit 214A, a voltage injection unit 214B, and a bias voltage generation unit 214C.

The injection locking digitally controlled oscillator 210 controls the frequency of an internal output clock signal CK_injdco<3:0> according to the oscillation driving signal S_injdco<9:0> and an injected frequency locking bias voltage Vbias (hereafter, referred to as a bias voltage). The internal output clock signal CK_injdco<3:0> is converted into the output clock signal CK_out<3:0> through the output buffer BUF211.

The output clock signal generation unit 212 includes four stages of inverters I211 to I214, and generates the internal output clock signal CK_injdco<3:0> having four different phases. The output clock signal generation unit 212 includes four latches LAT211 to LAT214 configured to latch the opposite phases to the output terminals of the four inverters I211 to I214.

The latches LAT211 to LAT214 receive the frequency control voltage Vctrl obtained by level-shifting the supply voltage VDD through the MOS transistors M201 to M204. In this way, the operating voltage of the internal output clock signal CK_injdco<3:0> has a range from VSS to VDD, without using the level shifter. Thus, since the output clock signal generation unit 212 does not use a separate level shifter, power consumption can be reduced as much.

The frequency of the internal output clock signal CK_out<3:0> is controlled through the frequency control voltage Vctrl, and the frequency control voltage Vctrl is generated by the current-control-type digital-to-analog converter 211 including the MOS transistors M201 to M204. Therefore, the power consumption for generating the frequency control voltage Vctrl can be minimized.

In order to control the operation of the digital-to-analog converter 211, the bias voltage Vbias and the inverted oscillation driving signal S_injdco<9:0>_Bar obtained by inverting the oscillation driving signal S_injdco<9:0> are inputted.

Thus, in the coarse frequency lock mode, the frequency of the output clock signal CK_out<3:0> is controlled by the oscillation driving signal S_injdco<9:0>, and in the injection frequency lock mode, the frequency of the output clock signal CK_out<3:0> is controlled by the bias voltage Vbias.

The injection lock unit 213 serves to injection-lock the phase of the internal output clock signal CK_injdco<3:0> of the injection locking digitally controlled oscillator 210.

When the injection pulse S_injpulse is high, the MOS transistor M205 of the injection lock unit 213 is turned on. Then, the first-phase internal output clock signal CK_injdco<0> is supplied to one terminal of the MOS transistor M205, and the third-phase internal output clock signal CK_injdco<2> is supplied to the other terminal of the MOS transistor M205.

Thus, during the period in which the injection pulse S_injpulse is high, the first-phase internal output clock signal CK_injdco<0> and the third-phase internal output clock signal CK_injdco<2> are shorted by the turned-on MOS transistor M205, and the phases of the first-phase internal output clock signal CK_injdco<0> and the third-phase internal output clock signal CK_injdco<2> are injection-locked. The injection-locking of the phase may indicate that, when the first-phase internal output clock signal CK_injdco<0> and the third-phase internal output clock signal CK_injdco<2> are shorted, the voltage levels of the first-phase internal output clock signal CK_injdco<0> and the third-phase internal output clock signal CK_injdco<2> are becomes ½ of VDD at the period in which the injection pulse is high, and the phases of the first-phase internal output clock signal CK_injdco<0> and the third-phase internal output clock signal CK_injdco<2> are not changed.

Furthermore, the second-phase internal output clock signal CK_injdco<1> and the fourth-phase internal output clock signal CK_injdco<3> are supplied to both terminals (drain and source) of the MOS transistor M206, and the ground voltage VSS is supplied to the gate of the MOS transistor M206. The MOS transistor M206 plays no role in injection-locking a phase. However, the MOS transistor M206 adjusts capacitances exhibited by the respective internal output clock signals CK_injdco<3:0> to almost the same value, such that the internal output clock signals CK_injdco<3:0> have a phase difference of 90 degrees therebetween.

The injected frequency lock unit 214 serves to lock the injected frequency using the internal output clock signal CK_injdco<3:0> and the injection pulse S_injpulse inputted from the injection pulse generator 231, during the injected frequency lock process.

For this operation, the injected frequency lock unit 214 includes an initial condition setting unit 214A, a voltage injection unit 214B, and a bias voltage generation unit 214C.

The initial condition setting unit 214A includes four diode-coupled MOS transistors M211 to M214 coupled in series between the supply voltage VDD and the ground voltage VSS, and outputs a bias voltage Vbias having a level corresponding to ½ of VDD through an intermediate connection node MN therebetween.

The voltage injection unit 214B includes a MOS transistor M215, a capacitor C201, and a capacitor C202. The MOS transistor M215 has a one terminal (for example, source) coupled to an injection voltage terminal Vinj, the other terminal (for example, drain) coupled to a bias voltage terminal Vbias, and a gate configured to receive the injection pulse S_injpulse. The capacitor C201 is coupled between the one terminal of the MOS transistor M215 and the ground voltage VSS, and the capacitor C202 is coupled between the other terminal of the MOS transistor M215 and the ground voltage VSS.

The bias voltage generation unit 214C includes MOS transistors M221 and M222 of which one terminals are commonly coupled to the supply voltage VDD and the gates are coupled to each other; a MOS transistor M223 having one terminal coupled to the other terminal of the first MOS transistor M221 and a gate configured to receive the injection pulse S_injpulse; a MOS transistor M222 having one terminal commonly coupled to the gate and the other terminal of the MOS transistor M222 and a gate configured to receive the injection pulse S_injpulse; MOS transistors M225 and M226 and MOS transistors M229 and M230 coupled in series between the other terminal of the MOS transistor M223 and the ground voltage; and MOS transistors M227 and M228 and the MOS transistors M231 and M232 coupled in series between the other terminal of the MOS transistor M224 and the ground voltage.

The initial condition setting unit 214A is a circuit for generating the initial voltage of the bias voltage Vbias which is an input of the digital-to-analog converter 211. The initial condition setting unit 214A generates the bias voltage Vbias having a level corresponding to ½ of VDD through the intermediate connection node MN of the four diode-coupled MOS transistor M211 to M214, before the injected frequency lock operation is started.

During the period in which the injection pulse S_injpulse is low, the MOS transistor M215 of the voltage injection unit 214B is turned on by the low-level injection pulse S_injpulse, and transmits the injection voltage Vinj generated by the bias voltage generation unit 214C as the bias voltage Vbias. However, during the period in which the injection pulse S_injpulse is high, the MOS transistor M215 of the voltage injection unit 214B is turned off by the high-level injection pulse S_injpulse, and blocks the connection between the bias voltage Vbias and the injection voltage Vinj. Thus, as soon as the injection voltage Vinj is injected as the bias voltage Vbias, fluctuation of the injection voltage Vinj is prevented.

The bias voltage generation unit 214C is not operated at the period in which the injection pulse S_injpulse is low. Thus, the injection voltage Vinj is not changed, and the frequency of the output clock signal CK_out<3:0> is not changed. However, during the period in which the injection pulse S_injpulse is high, the bias voltage generation unit 214C controls the injection voltage Vinj and locks the frequency of the output clock signal CK_out<3:0>, according to the four internal output clock signals CK_injdco<3:0> having different phases.

When the injection pulse S_injpulse is high, the bias voltage generation unit 214C locks the frequency through the following method.

At this time, the phases of the internal output clock signal CK_injdco<3:0> are divided into two cases as illustrated in FIGS. 8A and 8B.

The first phase CK_injdco<0> and the third phase CK_injdco<2> of the internal output clock signal CK_injdco<3:0> are shorted by the MOS transistor M205, and have the same level corresponding to ½ of the supply voltage VDD.

However, comparing the second phase CK_injdco<1> and the fourth phase CK_injdco<3> of the internal output clock signal CK_injdco<3:0>, the phases of the internal output clock signal CK_injdco<3:0> are divided into a first case Case1 in which the second phase CK_injdco<1> has a voltage level close to VDD and the fourth phase CK_injdco<3> has a voltage level close to VSS as illustrated in FIG. 8A and a second case Case2 in which the second phase CK_injdco<1> has a voltage level close to VSS and the fourth phase CK_injdco<3> has a voltage level close to VDD as illustrated in FIG. 8B.

In the first case Case1, if the frequency of the internal output clock signal CK_injdco<3:0> is lower than the target frequency, the first phase CK_injdco<0> has a higher voltage level than the third phase CK_injdco<2>, the second phase CK_injdco<1> has a voltage level close to VDD, and the fourth phase CK_injdco<3> has a voltage level close to VSS. Therefore, the bias voltage generation unit 214C forms a first current path Current_Path_1 in which the fifth and sixth MOS transistors M225 and M226 are turned on. Then, when the injection pulse S_injpulse is high, the injection voltage Vinj is lowered, and the frequency of the internal output clock signal CK_injdco<3:0> is increased.

In the first case Case1, if the frequency of the internal output clock signal CK_injdco<3:0> is higher than the target frequency, the first phase CK_injdco<0> has a lower voltage level than the third phase CK_injdco<2>, the second phase CK_injdco<1> has a voltage level close to VDD, and the fourth phase CK_injdco<3> has a voltage level close to VSS. Therefore, the bias voltage generation unit 214C forms a second current path Current_Path_2 in which the seventh and eighth MOS transistors M227 and M228 of are turned on. Then, when the injection pulse S_injpulse is high, the injection voltage Vinj is raised, and the frequency of the internal output clock signal CK_injdco<3:0> is decreased.

In the second case Case2, if the frequency of the internal output clock signal CK_injdco<3:0> is lower than the target frequency, the first phase CK_injdco<0> has a lower voltage level than the third phase CK_injdco<2>, the second phase CK_injdco<1> has a voltage level close to VSS, and the fourth phase CK_injdco<3> has a voltage level close to VDD. Therefore, the bias voltage generation unit 214C forms a third current path Current_Path_3 in which the ninth and tenth MOS transistors M229 and M230 are turned on. Then, when the injection pulse S_injpulse is high, the injection voltage Vinj is lowered, and the frequency of the internal output clock signal CK_injdco<3:0> is increased.

In the second case Case2, if the frequency of the internal output clock signal CK_injdco<3:0> is higher than the target frequency, the first phase CK_injdco<0> has a higher voltage level than the third phase CK_injdco<2>, the second phase CK_injdco<1> has a voltage level close to VSS, and the fourth phase CK_injdco<3> has a voltage level close to VDD. Therefore, the bias voltage generation unit 214C forms a fourth current path Current_Path_4 in which the 11th and 12th MOS transistors M231 and M232 are turned on. Then, when the injection pulse S_injpulse is high, the injection voltage Vinj is raised, and the frequency of the internal output clock signal CK_injdco<3:0> is decreased.

As the above-described injected frequency lock process is performed, the injection lock unit 213 controls the bias voltage Vbias using the injection pulse S_injpulse and the internal output clock signal CK_injdco<3:0>, such that the frequency of the output clock signal CK_out<3:0> is more accurately locked to the target frequency.

Figure 9:
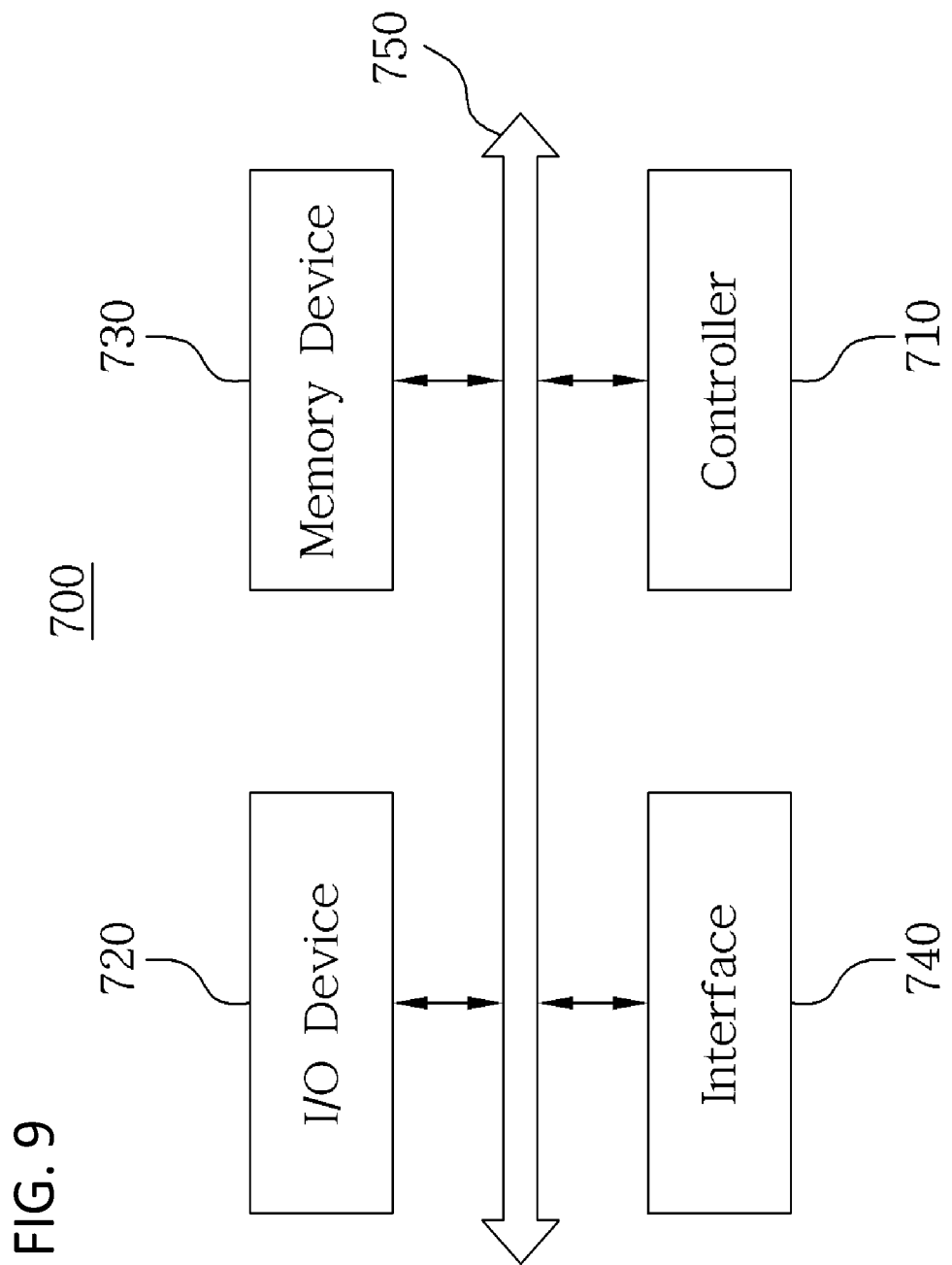
FIG. 9 is a block diagram of an electronic system including the semiconductor device according to the embodiments of the present invention.

FIG. 9 is a block diagram of an electronic system including the semiconductor device according to the embodiments of the present invention.

Referring to FIG. 9, the electronic system 700 according to the embodiment of the present invention may include a controller 710, an input/output device 720, a memory device 730, an interface 740, and a bus 750. The controller 710, the input/output device 720, the memory device 730, and the interface 740 may be coupled to each other through the bus 750. The bus 750 corresponds to a path through which data are transferred.

The controller 710 may include one or more of a microprocessor, a digital signal processor, a microcontroller, and logic elements capable of performing similar functions to the microprocessor, the digital signal processor, and the microcontroller. The input/output device 720 may include a keypad, a keyboard, and a display device. The memory device 730 may store data and/or commands. The memory device 730 may include one or more of the semiconductor devices disclosed in the embodiments of the present invention. The memory device 730 may further include other types of semiconductor memory elements (for example, Flash memory, DRAM, and SRAM). The interface 740 may transmit or receive data to or from a communication network. The interface 740 may include a wired or wireless interface. For example, the interface 740 may include an antenna or wired/wireless transceiver.

Although not illustrated, the electronic system 700 according to the embodiment of the present invention may further include high-speed DRAM or SRAM which serves as a working memory for improving the operation of the controller 710.

The embodiments of the present invention can be applied to an up link and a down link. The embodiments of the present invention can be applied to all modulation schemes such as OFDMA, CDMA, and SC-OFDMA. The embodiments of the present invention can be applied to a mobile device and a desktop device. The embodiments of the present invention can be implemented in a DSP (Digital Signal Processor) or ASIC (Application Specific Integrated Circuit).

The electronic system 700 according to the embodiment of the present invention can be implemented in a PDA (Personal Digital Assistant), a portable computer, a web tablet, a wireless phone, a mobile phone, a digital music player, a memory card, or all electronic products capable of transmitting and receiving information in a wireless environment.

While various embodiments have been described above, it will be understood to those skilled in the art that the embodiments described are by way of example only. Accordingly, the disclosure described herein should not be limited based on the described embodiments.

The invention claimed is:

1. An injection locked digital frequency synthesizer circuit comprising:
   a frequency synthesizer configured to perform a frequency and phase lock operation according to fractional number information and a first reference clock signal supplied from outside, and output a reset signal and a second reference clock signal; and
   an injection locked Phase Locked Loop (PLL) configured to start a frequency lock operation after being reset by the reset signal inputted when the frequency synthesizer is frequency-locked, receive the second reference clock signal as a reference clock, multiply the second reference clock signal by an integer multiple of target frequency, and output an output clock signal,
   wherein the frequency synthesizer comprises:
      an injection locking digitally controlled oscillator configured to generate an oscillation clock signal which has three different phases oscillating at a preset frequency and has an oscillation frequency corresponding to a coarse digital oscillation driving signal, in a coarse frequency lock mode, and generate an oscillation clock signal having a frequency corresponding to a fine digital oscillation driving signal in a fine frequency lock mode;
      a coarse frequency lock operation unit configured to output the coarse digital oscillation driving signal whenever performing a coarse frequency lock step a preset number of times, in the coarse frequency lock mode, wherein during the coarse frequency lock step, the coarse frequency lock operation unit compares the frequencies of the first reference clock signal and the oscillation clock signal and schematically locks the frequency of the oscillation clock signal; and
      a fine frequency lock operation unit configured to output the fine digital oscillation driving signal based on a phase difference between the first reference clock signal and a divided clock signal until the frequency and phase of the second reference clock signal are locked to a preset extent and output the reset signal to start the frequency lock operation of the injection locked PLL, in the fine frequency lock mode.

2. The injection locked digital frequency synthesizer circuit of claim 1, wherein the injection locking digitally controlled oscillator comprises:
   a digital-to-analog converter comprising a plurality of upper MOS transistors and lower MOS transistors which are coupled in series between a supply voltage terminal and a common node;
   first to third inverters configured in three stages to output clock signals according to a frequency control voltage outputted from the common node;
   a regulator configured to output a supply terminal voltage having a lower level than the supply voltage, using the frequency control voltage outputted from the common node;
   a fourth inverter configured to invert the coarse digital oscillation driving signal and output the inverted coarse digital oscillation driving signal to the gates of partial lower MOS transistors of the digital-to-analog converter;
   a fifth inverter configured to invert the fine digital oscillation driving signal and output the inverted fine digital oscillation driving signal to the gates of the other lower MOS transistors of the digital-to-analog converter; and
   an output buffer configured to convert the level range of the clock signal outputted through the first to third inverters in three stages into the level range between a ground voltage and the supply terminal voltage outputted from the regulator.

3. The injection locked digital frequency synthesizer circuit of claim 2, wherein the supply terminal voltage outputted from the regulator is used as a supply voltage for the output buffer and all blocks of the frequency synthesizer, such that a level shifter is omitted.

4. The injection locked digital frequency synthesizer circuit of claim 1, wherein the coarse frequency lock operation unit comprises:
- a first on/off logic unit configured to bypass or block the oscillation clock signal and the first reference clock signal according to a coarse frequency locking end signal; and
- a first coarse frequency lock unit configured to output the coarse digital oscillation driving signal whenever performing the coarse frequency lock step the preset number of times, wherein during the coarse frequency lock step, the first coarse frequency lock unit compares the frequencies of the first reference clock signal and the oscillation clock signal which are supplied through the first on/off logic unit, and schematically locks the frequency of the oscillation clock signal.

5. The injection locked digital frequency synthesizer circuit of claim 4, wherein the first coarse frequency lock unit receives the fractional number information and the output clock signal having different phases, and performs frequency locking for a fractional-N PLL.

6. The injection locked digital frequency synthesizer circuit of claim 4, wherein the first on/off logic unit comprises:
- a first inverter configured to invert the coarse frequency locking end signal;
- a first NAND gate having one input terminal configured to receive the oscillation clock signal and the other input terminal configured to receive an output signal of the first inverter;
- a second NAND gate having one input terminal configured to receive the output signal of the first inverter and the other input terminal configured to receive the first reference clock signal;
- a second inverter configured to invert an output signal of the first NAND gate; and
- a third inverter configured to invert an output signal of the second NAND gate.

7. The injection locked digital frequency synthesizer circuit of claim 1, wherein the fine frequency lock operation unit comprises:
- a second on/off logic unit configured to bypass or block the first reference clock signal and the divided clock signal according to a coarse frequency locking end signal;
- a linear time-to-digital converter configured to receive the first reference clock signal and the divided clock signal from the second on/off logic unit and convert a phase difference between the first reference clock signal and the divided clock signal into a digital code value;
- a delta-sigma time-to-digital converter configured to alternately output low and high signals, when the frequency and phase of the second reference clock signal are locked to a preset extent by the linear time-to-digital converter;
- a lock detector configured to detect that the low and high signals are alternately outputted from the delta-sigma time-to-digital converter and output a switching control signal according to the detection result;
- a digital loop filter configured to be switched by the switching control signal in the initial state, select the digital code value supplied from the linear time-to-digital converter, and select an output signal of the delta-sigma time-to-digital converter when the frequency and phase of the second reference clock signal are locked to the preset extent;
- a primary delta-sigma modulator configured to bypass a part of an integrated difference frequency digital signal outputted from the digital loop filter, modulate the other part of the integrated difference frequency digital signal into a second divided clock signal, add the one-bit modulated signal and the upper seven bits of the integrated difference-frequency digital signal, and output the result signal as the fine digital oscillation driving signal;
- a tertiary delta-sigma modulator configured to generate an output signal having a low or high level at a frequency corresponding to the fractional number information supplied from outside and lock the frequency of the second reference clock signal to a fractional value between two integer multiples adjacent to the frequency of the first reference clock signal;
- a first divider configured to divide the oscillation clock signal supplied from the digitally controlled oscillator and supply a divided clock signal to the digital loop filter; and
- a second divider configured to divide the oscillation clock signal supplied from the digitally controlled oscillator and supply a second divided clock signal to the primary delta-sigma modulator.

8. The injection locked digital frequency synthesizer circuit of claim 1, wherein the frequency synthesizer comprises:
- a buffer configured to buffer the oscillation clock signal supplied from the digitally controlled oscillator and output the buffered signal as the second reference clock signal; and
- an inverter configured to invert a switching control signal outputted from the fine frequency lock operation unit and output the inverted signal as the reset signal.

9. The injection locked digital frequency synthesizer circuit of claim 1, wherein the injection locked PLL comprises:
- an injection locking digitally controlled oscillator configured to generate the output clock signal having a plurality of phases which oscillate at a preset frequency according to an oscillation driving signal;
- a third on/off logic unit configured to transmit the second reference clock signal and the output clock signal to the next stage or block the second reference clock signal and the output clock signal, according to a coarse frequency locking end signal;
- a second coarse frequency lock unit configured to output the coarse frequency locking end signal and output a oscillation driving signal with a predetermined number of bits whenever performing a fine frequency lock step a preset number of times, wherein during the fine frequency lock step, the second coarse frequency lock unit compares the frequencies of the second reference clock signal and the output clock signal, and locks the frequency of the output clock signal;
- a fourth on/off logic unit configured to output the output clock signal having a frequency close to the target frequency according to control of the oscillation driving signal, when the preset number of coarse frequency lock steps are ended after the coarse frequency lock operation is started at the point of time that the frequency synthesizer is frequency-locked; and
- an injection pulse generator configured to receive the second reference clock signal to generate the injection pulse, and output the generated injection pulse to the injection locking digitally controlled oscillator.

10. The injection locked digital frequency synthesizer circuit of claim 9, wherein the third on/off logic unit comprises:
- a first inverter configured to invert the coarse frequency locking end signal;
- a first NAND gate having one input terminal configured to receive the output clock signal and the other input terminal configured to receive an output signal of the first inverter;
- a second NAND gate having one input terminal configured to receive the output signal of the first inverter and the other input terminal configured to receive the second reference clock signal;
- a second inverter configured to invert an output signal of the first NAND gate and output the inverted signal to the second coarse frequency lock unit; and
- a third inverter configured to invert an output signal of the second NAND gate and output the inverted signal to the second coarse frequency lock unit.

11. The injection locked digital frequency synthesizer circuit of claim 9, wherein the third on/off logic unit transmits the second reference clock signal and the output clock signal to the next stage in the initial state.

12. The injection locked digital frequency synthesizer circuit of claim 9, wherein the third on/off logic unit transmits the second reference clock signal and the output clock signal to the second coarse frequency lock unit at the next stage, as the coarse frequency locking end signal is inputted at a low level in the initial state.

13. The injection locked digital frequency synthesizer circuit of claim 9, wherein the injection pulse outputted from the injection pulse generator is generated once during one cycle of the second reference clock signal, and injection-locks the phases of internal output clock signals of the injection locking digitally controlled oscillator.

14. The injection locked digital frequency synthesizer circuit of claim 9, wherein the injection locking digitally controlled oscillator comprises:
- a current-control-type digital-to-analog converter comprising a plurality of MOS transistors driven by the inverted oscillation driving signal and the bias voltage and configured to generate a frequency control voltage for controlling the frequency of an internal output clock signal;
- an output clock signal generation unit configured to receive the frequency control voltage and generate internal output clock signals having different phases;
- an injection lock unit configured to injection-lock the phases of the internal output clock signals using the injection pulse; and
- an injected frequency lock unit configured to lock an injected frequency using the internal output clock signals and the injection pulse inputted from the injection pulse generator, during an injected frequency lock process.

15. The injection locked digital frequency synthesizer circuit of claim 14, wherein the digital-to-analog converter supplies the frequency control voltage obtained by level-shifting the supply voltage, using a plurality of MOS transistors driven by the inverted oscillation driving signal and the bias voltage.

16. The injection locked digital frequency synthesizer circuit of claim 14, wherein the output clock signal generation unit comprises:
- inverters configured in four stages to generate the internal output clock signals having different phases; and
- four latches configured to latch the opposite phases to output terminals of the inverters in four stages.

17. The injection locked digital frequency synthesizer circuit of claim 14, wherein the injection lock unit comprises:
- a fifth MOS transistor configured to be turned on by the injection pulse and short the first-phase internal output clock signal and the third-phase internal output clock signal such that the voltage levels thereof become ½ of the supply voltage and the phases thereof are injection-locked; and
- a sixth MOS transistor configured to receive the second-phase internal output clock signal and the fourth-phase internal output clock signal through both terminals thereof, and receive a ground voltage through the gate thereof.

18. The injection locked digital frequency synthesizer circuit of claim 14, wherein the injected frequency lock unit comprises:
- an initial condition setting unit comprising four diode-coupled MOS transistors coupled in series between a supply voltage terminal and a ground voltage terminal, and configured to output a bias voltage having a level corresponding to ½ of the supply voltage through an intermediate connection node;
- a voltage injection unit comprising a 15th MOS transistor having one terminal coupled to the terminal of the injection pulse, the other terminal coupled to a bias voltage terminal, and a gate configured to receive the injection pulse; a first capacitor coupled between the one terminal of the 15th MOS transistor and the ground voltage; and a second capacitor coupled between the other terminal of the 15th MOS transistor and the ground voltage; and
- a bias voltage generation unit comprising 21st and 22nd MOS transistors having one terminals commonly coupled to the supply voltage and gates coupled to each other; a 23rd MOS transistor having one terminal coupled to the other terminal of the 21st MOS transistor and a gate configured to receive the injection pulse; a 24th MOS transistor having one terminal commonly coupled to the gate and the other terminal of the 22nd MOS transistor and a gate configured to receive the injection pulse; 25th and 26th MOS transistors and 29th and 30th MOS transistors coupled in series between the other terminal of the 23rd MOS transistor and the ground voltage; and 27th and 28th MOS transistors and 31st and 32nd MOS transistors coupled in series between the other terminal of the 23rd MOS transistor and the ground voltage.

19. The injection locked digital frequency synthesizer circuit of claim 18, wherein the injected frequency lock unit further comprises an output buffer configured to convert the internal output clock signal into the output clock signal.

* * * * *